US008889479B2

(12) United States Patent
Kumar et al.

(10) Patent No.: US 8,889,479 B2
(45) Date of Patent: *Nov. 18, 2014

(54) NONVOLATILE MEMORY ELEMENTS WITH METAL-DEFICIENT RESISTIVE-SWITCHING METAL OXIDES

(71) Applicant: Intermolecular, Inc., San Jose, CA (US)

(72) Inventors: Nitin Kumar, Fremont, CA (US); Tony P. Chiang, Campbell, CA (US); Chi-I Lang, Cupertino, CA (US); Prashant B. Phatak, San Jose, CA (US); Jinhong Tong, Santa Clara, CA (US)

(73) Assignee: Intermolecular, Inc., San Jose, CA (US)

( * ) Notice: Subject to any disclaimer, the term of this patent is extended or adjusted under 35 U.S.C. 154(b) by 129 days.

This patent is subject to a terminal disclaimer.

(21) Appl. No.: 13/675,695

(22) Filed: Nov. 13, 2012

(65) Prior Publication Data

US 2013/0071982 A1    Mar. 21, 2013

Related U.S. Application Data

(63) Continuation of application No. 13/312,061, filed on Dec. 6, 2011, now Pat. No. 8,344,375, which is a continuation of application No. 11/714,326, filed on Mar. 5, 2007, now Pat. No. 8,097,878.

(51) Int. Cl.
| *H01L 21/00* | (2006.01) |
| *H01L 45/00* | (2006.01) |
| *G11C 13/00* | (2006.01) |
| *H01L 27/24* | (2006.01) |

(52) U.S. Cl.
CPC ........ *G11C 13/0007* (2013.01); *G11C 2213/52* (2013.01); *H01L 45/1608* (2013.01); *H01L 45/1253* (2013.01); *H01L 45/04* (2013.01); *H01L 45/1233* (2013.01); *G11C 2213/73* (2013.01); *H01L 45/146* (2013.01); *G11C 2213/32* (2013.01); *G11C 2213/72* (2013.01); *H01L 27/2463* (2013.01)
USPC .................. 438/104; 438/678; 257/4; 365/51

(58) Field of Classification Search
USPC ........................................... 257/2–4; 438/678
See application file for complete search history.

(56) References Cited

U.S. PATENT DOCUMENTS

| 7,629,198 B2 * | 12/2009 | Kumar et al. ................. 438/104 |
| 2005/0121743 A1 * | 6/2005 | Herner ........................... 257/530 |

OTHER PUBLICATIONS

R. Pantel, "Oxygen Behavior during Titanium Silicide Formation by Rapid Thermal Annealing", Jul. 13, 1987, AIP Publishing, Journal of Applied Physics 62, 4319.*
R. Pantel, "Oxygen Behavior During Titanium Silicide Formation by Rapid Thermal Annealing", Jul. 13, 1987, Journal of Applied Physics, 62.*

* cited by examiner

*Primary Examiner* — Matthew W Such
*Assistant Examiner* — Frederick B Hargrove

(57) ABSTRACT

Nonvolatile memory elements are provided that have resistive switching metal oxides. The nonvolatile memory elements may be formed by depositing a metal-containing material on a silicon-containing material. The metal-containing material may be oxidized to form a resistive-switching metal oxide. The silicon in the silicon-containing material reacts with the metal in the metal-containing material when heat is applied. This forms a metal silicide lower electrode for the nonvolatile memory element. An upper electrode may be deposited on top of the metal oxide. Because the silicon in the silicon-containing layer reacts with some of the metal in the metal-containing layer, the resistive-switching metal oxide that is formed is metal deficient when compared to a stoichiometric metal oxide formed from the same metal.

19 Claims, 7 Drawing Sheets

NONVOLATILE MEMORY ELEMENTS WITH METAL-DEFICIENT RESISTIVE-SWITCHING METAL OXIDES

CROSS-REFERENCE TO RELATED APPLICATIONS

This application is a Continuation Application of U.S. patent application Ser. No. 13/312,061 entitled "Nonvolatile Memory Elements with Metal-Deficient Resistive-Switching Metal Oxides" filed Dec. 6, 2011 with a Notice of Allowance date of Sep. 19, 2012, which is a Continuation Application of U.S. patent application Ser. No. 11/714,326 entitled "Nonvolatile Memory Elements with Metal-Deficient Resistive-Switching Metal Oxides" filed Mar. 5, 2007, both of which are herein incorporated by reference for all purposes.

FIELD OF THE INVENTION

This invention relates to nonvolatile memory elements, and more particularly, to nonvolatile resistive switching memory elements.

BACKGROUND OF THE INVENTION

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments.

Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly small dimensions. However, as device dimensions shrink, scaling issues are posing challenges for traditional nonvolatile memory technology. This has led to the investigation of alternative nonvolatile memory technologies, including resistive switching nonvolatile memory.

Resistive switching nonvolatile memory is formed using memory elements that have two or more stable states with different resistivities (i.e., resistances). Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Resistive switching based on nickel oxide switching elements and other transition metal oxide switching elements has been demonstrated. Nickel oxide films for these elements have been formed using sputtering techniques. With these techniques it has been possible to produce nickel oxide ($Ni_xO$) films with sub-stoichiometric compositions in the range of $Ni_{0.8}O$ to $Ni_{0.95}O$. Films such as these show promise for resistive switching applications, but generally have film densities that are no less than 80% of the stoichiometric metal oxide (e.g., 5.4 to 5.8 $g/cm^3$ for nickel oxide) and relatively low film resistivities (e.g., generally less than 10 ohm-cm for nickel oxide). With conventional fabrication techniques, it has not been possible to produce metal oxide films that are super sub-stoichiometric (i.e., highly metal deficient $NiO_x$ with x<0.8 or x<0.65). Because metal-deficient metal oxide films may have advantageous qualities for resistive switching applications such as high resistance (and low density), it would be desirable if there were improved ways of forming such films for non-volatile memory elements.

SUMMARY OF THE DISCLOSURE

In accordance with the present invention, nonvolatile memory elements and methods of fabrication are provided. The nonvolatile memory elements may have resistive-switching metal oxide layers. Stacked nonvolatile memory element arrangements and nonvolatile memory elements with resistive-switching metal oxides that are connected in series with current steering elements such as diodes and transistors may also be provided.

The nonvolatile memory elements may be formed by depositing a silicon-containing layer on an integrated circuit substrate. The substrate may be formed of silicon or other suitable materials. One or more stacked layers of nonvolatile memory elements may be fabricated on the substrate before the silicon-containing layer is deposited. The silicon-containing layer may be formed from polysilicon or any other suitable material that contains silicon.

A metal-containing layer may be deposited on the silicon-containing layer. The metal-containing layer may contain a metal such nickel or other suitable transition metals. One or more dopant materials such as phosphorus may be deposited with the metal-containing layer or may be added to the metal-containing layer (e.g., by on implantation, electroless deposition, etc). Suitable techniques for depositing the metal-containing layer include physical vapor deposition techniques, chemical vapor deposition techniques, atomic layer deposition (ALD) techniques, and electrochemical deposition techniques (e.g., electroless deposition techniques or electroplating techniques).

The metal-containing layer may be oxidized to form the resistive-switching metal oxide layer. Suitable oxidation techniques that may be used to form the metal oxide layer include ion implantation of oxygen ions, thermal oxidation (e.g., using rapid thermal oxidation techniques, laser-induced thermal oxidation, or furnace oxidation), and plasma oxidation.

During thermal oxidation or during one or more separate heating operations, heat is applied that causes the metal in the metal-containing layer to react with the silicon in the silicon-containing layer. This reaction forms a metal silicide layer. The metal silicide layer is conductive and can be used to form a lower electrode for the nonvolatile memory element. Because some of the metal in the metal-containing layer reacts with the silicon, there is an increase in metal deficiency in the metal oxide layer relative to the case without the silicon-containing layer. The metal oxide layer formed in this fashion is therefore more metal deficient when compared to either i) an as-deposited metal oxide comprising the same metal or ii) a deposited metal with subsequent oxidation without the presence of the silicon-containing layer. In one embodiment, the simultaneous reactions of silicidation and oxidation limit the amount of metal available for oxidation, which results in i) highly metal deficient, ii) super sub-stoichiometric, iii) low density metal oxide films.

The metal in the metal oxide and the metal in the metal silicide layer are generally the same metal, because these metals originate from the same metal in the metal-containing layer.

Further features of the invention, its nature and various advantages will be more apparent from the accompanying drawings and the following detailed description.

DETAILED DESCRIPTION

Embodiments of the present invention relate to nonvolatile memory formed from resistive switching elements. Embodiments of the invention also relate to fabrication methods that may be used to form nonvolatile memory having resistive switching memory elements.

Resistive switching elements may be formed on any suitable type of integrated circuit. Most typically, resistive switching memory elements may be formed as part of a high-capacity nonvolatile memory integrated circuit. Nonvolatile memory integrated circuits are often used in portable devices such as digital cameras, mobile telephones, handheld computers, and music players. In some arrangements, a nonvolatile memory device may be built into mobile equipment such as a cellular telephone. In other arrangements, nonvolatile memory devices are packaged in memory cards or memory keys that can be removably installed in electronic equipment by a user.

The use of resistive switching memory elements to form memory arrays on memory devices is merely illustrative. In general, any suitable integrated circuit may be formed using the resistive switching structures of the present invention. Fabrication of memory arrays formed of resistive switching memory elements is described herein as an example.

Figure 1:
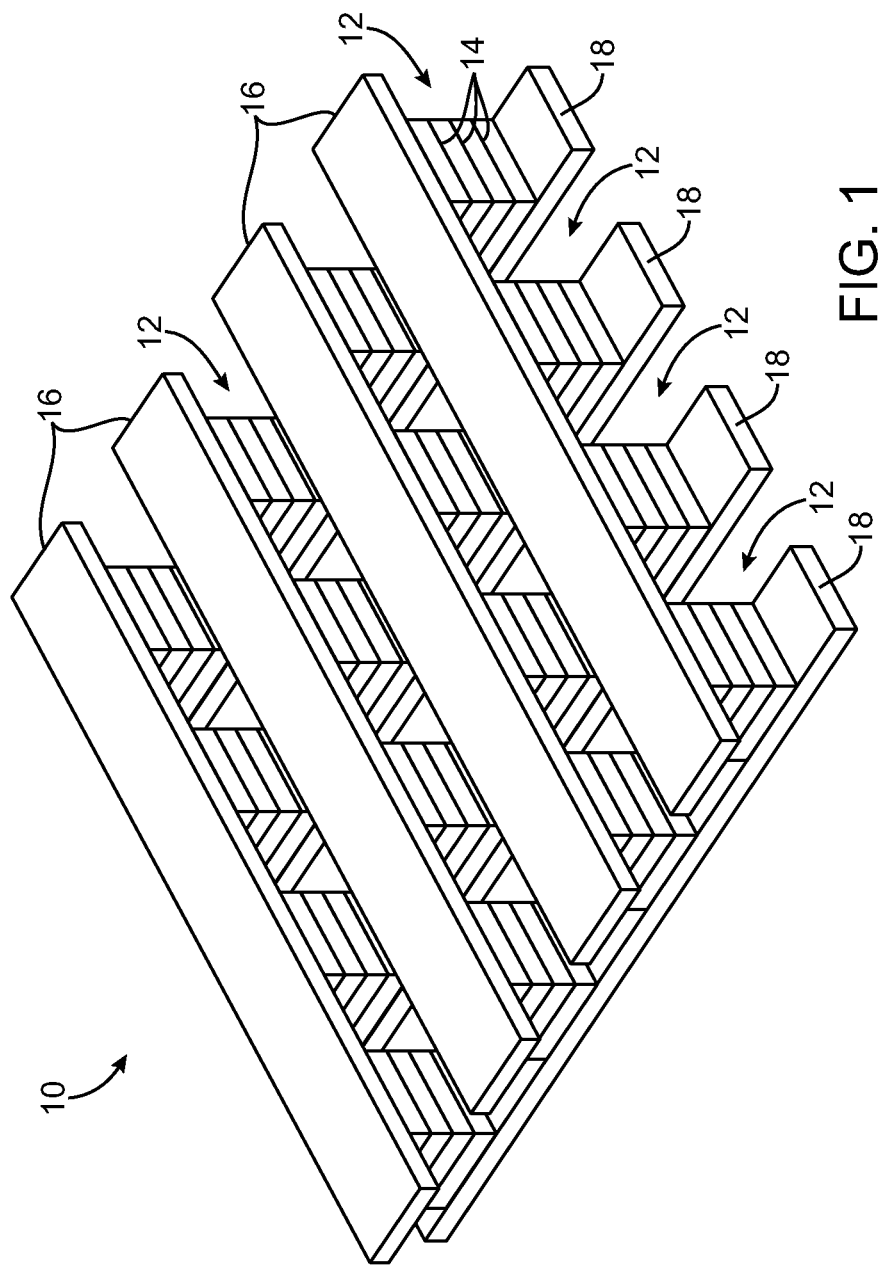
FIG. 1 is a diagram of an illustrative array of resistive switching memory elements in accordance with an embodiment of the present invention.

An illustrative memory array 10 of nonvolatile resistive switching memory elements 12 is shown in FIG. 1. Memory array 10 may be part of a memory device or other integrated circuit. Read and write circuitry is connected to memory elements 12 using conductors 16 and orthogonal conductors 18. Conductors such as conductors 16 and conductors 18 are sometimes referred to as word lines and bit lines and are used to read and write data into the elements 12 of array 10. Individual memory elements 12 or groups of memory elements 12 can be addressed using appropriate sets of conductors 16 and 18. Memory element 12 may be formed from one or more layers of materials, as indicated schematically by lines 14 in FIG. 1. In addition, memory arrays such as memory array 10 can be stacked in a vertical fashion to make multilayer memory array structures.

During a read operation, the state of a memory element 12 can be sensed by applying a sensing voltage to an appropriate set of conductors 16 and 18. Depending on its history, a memory element that is addressed in this way may be in either a high resistance state or a low resistance state. The resistance of the memory element therefore determines what digital data is being stored by the memory element. If the memory element has a high resistance, for example, the memory element may be said to contain a logic one (i.e., a "1" bit). If, on the other hand, the memory element has a low resistance, the memory element may be said to contain a logic zero (i.e., a "0" bit). During a write operation, the state of a memory element can be changed by application of suitable write signals to an appropriate set of conductors 16 and 18.

Figure 2A:
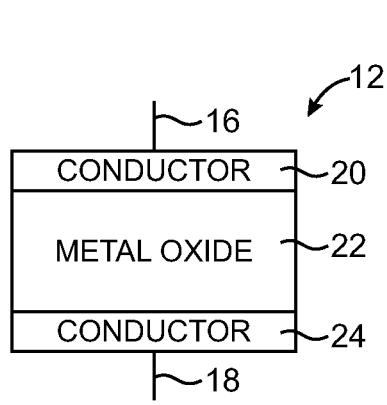
FIG. 2A is a cross-sectional view of an illustrative resistive switching nonvolatile memory element in accordance with an embodiment of the present invention.

A cross-section of an illustrative embodiment of a resistive switching memory element is shown in FIG. 2A. In the example of FIG. 2A, memory element 12 is formed from a metal oxide 22 and has conductive electrodes 20 and 24. When constructed as part of an array such as array 10 of FIG. 1, conductive lines such as lines 16 and 18 may be physically and electrically connected to electrodes 20 and 24. Such conductive lines may be formed from any suitable metals (e.g., tungsten, aluminum, copper, metal silicides, etc.). Conductive lines 16 and 18 may also be formed from other conductive materials (e.g., doped polysilicon, doped silicon, etc.) or combinations of conductive materials. If desired, conductive line 16 and conductive line 18 may serve as both conductive lines and as electrodes. In this type of arrangement, line 16 may serve as electrode 20, so that no separate conductor is needed to form an upper electrode for element 12. Similarly, line 18 may serve as electrode 24, so that no separate conductor is needed for the lower electrode of element 12.

In the diagram of FIG. 2A, conductive lines 16 and 18 are shown schematically as being formed in contact with electrodes 20 and 24. Other arrangements may be used if desired. For example, there may be intervening electrical components (e.g., diodes, p-i-n diodes, silicon diodes, silicon p-i-n diodes, transistors, etc.) that are formed between line 16 and electrode 20 or between line 18 and electrode 24.

Figure 2B:
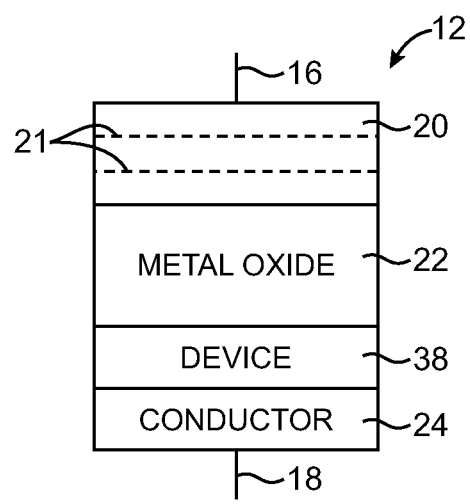
FIG. 2B is a cross-sectional view of an illustrative resistive switching nonvolatile memory element in accordance with another embodiment of the present invention.

If desired, there may be a series-connected electrical component between an electrode conductor and the resistive switching metal oxide. An illustrative arrangement in which there is an intervening electrical component 38 between conductor 24 and metal oxide 22 is shown in FIG. 2B.

As indicated schematically by dotted lines 21, conductive materials such as electrodes 24 and 20 may be formed from one or more layers of materials. Examples of materials that may be used to form electrodes 20 and 24 include metal (e.g., refractory or transition metals), metal alloys, metal nitrides (e.g., refractory metal nitrides), metal silicon nitrides (i.e., materials containing refractory metals, transition metals, or other metals, along with silicon and nitrogen), metal silicides, or other conductors. Metal oxide 22 may be formed from a metal oxide such as a transition metal oxide (e.g., nickel-based oxide).

In accordance with the present invention, a metal-deficient metal oxide may be formed on a metal silicide electrode by heating a structure that has an upper layer formed from a metal-containing material and a lower layer formed from a silicon-containing material.

Resistive switching memory element 12 exhibits a bistable resistance. When resistive switching memory element 12 is in a high resistance state, it may be said to contain a logic one. When resistive switching memory element 12 is in a low resistance state, it may be said to contain a logic zero. (If desired, high resistance can signify a logic zero and low resistance can signify a logic one.) The state of resistive switching memory element 12 may be sensed by application of a sensing voltage. When it is desired to change the state of resistive switching memory element 12, read and write circuitry may apply suitable control signals to suitable lines 16 and 18.

Figure 3:
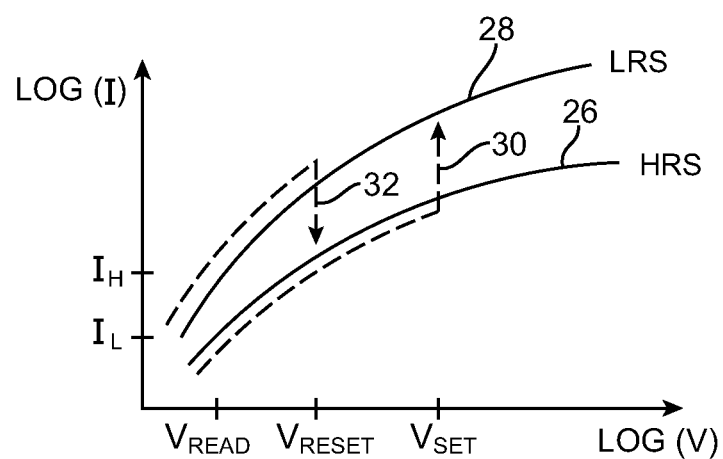
FIG. 3 is a graph showing how resistive switching nonvolatile memory elements of the types shown in FIGS. 2A and 2B may exhibit bistable behavior in accordance with an embodiment of the present invention.

A current (I) versus voltage (V) plot for device 12 is shown in FIG. 3. Initially, device 12 may be in a high resistance state (e.g., storing a logic one). In this state, the current versus voltage characteristic of device 12 is represented by solid line HRS 26. The high resistance state of device 12 can be sensed by read and write circuitry associated with an array of devices 12. For example, read and write circuitry may apply a read voltage $V_{READ}$ to device 12 and can sense the resulting low current $I_L$ that flows through device 12. When it is desired to store a logic zero in device 12, device 12 can be placed into its low-resistance state. This may be accomplished by using read and write circuitry to apply a voltage $V_{SET}$ across terminals 16 and 18 of device 12. Applying $V_{SET}$ to device 12 causes device 12 to enter its low resistance state, as indicated by dotted line 30. In this region, the structure of device 12 is changed (e.g., through the formation of current filaments through metal oxide 22 or other suitable mechanisms), so that, following removal of the voltage $V_{SET}$, device 12 is characterized by low resistance curve LRS 28.

The low resistance state of device 12 can be sensed using the read and write circuitry. When a read voltage $V_{READ}$ is applied to resistive switching memory element 12, the read and write circuitry will sense the relatively high current value $I_H$, indicating that device 12 is in its low resistance state. When it is desired to store a logic one in device 12, device 12 can once again be placed in its high resistance state by applying a voltage $V_{RESET}$ to device 12. When the read and write circuitry applies $V_{RESET}$ to device 12, device 12 enters its high resistance state HRS, as indicated by dotted line 32. When the voltage $V_{RESET}$ is removed from device 12, device 12 will once again be characterized by high resistance line HRS 26.

The bistable resistance of resistive switching memory element 12 makes memory element 12 suitable for storing digital data. Because no changes take place in the stored data in the absence of application of the voltages $V_{SET}$ and $V_{RESET}$, memory formed from elements such as element 12 is nonvolatile.

Any suitable read and write circuitry and array layout scheme may be used to construct a nonvolatile memory device from resistive switching memory elements such as element 12. For example, horizontal and vertical lines 16 and 18 may be connected directly to the terminals of resistive switching memory elements 12. This is merely illustrative. If desired, other electrical devices may be associated with each element 12.

Figure 4:
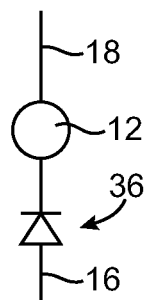
FIG. 4 is a schematic diagram of an illustrative resistive switching memory element in series with a diode in accordance with an embodiment of the present invention.

An example is shown in FIG. 4. As shown in FIG. 4, a diode 36 may be placed in series with resistive switching memory element 12. Diode 36 may be a Schottky diode, a p-n diode, a p-i-n diode, or any other suitable diode.

Figure 5:
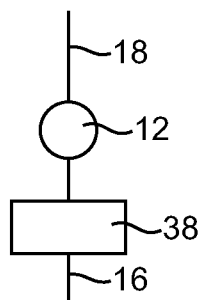
FIG. 5 is a schematic diagram of an illustrative resistive switching memory element in series with an electrical device in accordance with an embodiment of the present invention.
Figure 6:
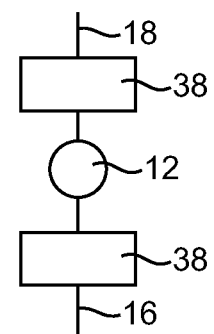
FIG. 6 is a schematic diagram of an illustrative resistive switching memory element in series with two electrical devices in accordance with an embodiment of the present invention.

If desired, other electrical components can be formed in series with resistive switching memory element 12. As shown in FIG. 5, series-connected electrical device 38 may be coupled to resistive switching memory element 12. Device 38 may be a diode, a transistor, or any other suitable electronic device. Because devices such as these can rectify or otherwise alter current flow, these devices are sometimes referred to as rectifying elements or current steering elements. As shown in FIG. 6, two electrical devices 38 may be placed in series with a resistive switching memory element 12. Electrical devices 38 may be formed as part of a nonvolatile memory element or may be formed as separate devices at potentially remote locations relative to a resistive switching metal oxide and its associated electrodes.

Memory elements 12 may be fabricated in a single layer in array 10 or may be fabricated in multiple layers forming a three-dimensional stack. An advantage of forming memory arrays such as memory array 10 of FIG. 1 using a multilayer memory element scheme is that this type of approach allows memory element density to be maximized for a given chip size.

If desired, a resistive switching metal oxide layer may be formed above or below a current steering element such as a diode. Conductive lines 16 and 18 may be electrically coupled to metal oxide 22 through a number of layers of conductive material. There may, in general, be any suitable number of conductive layers associated with resistive switching memory element 12. These conductive layers may be used for functions such as adhesion promotion, seed layers for subsequent electrochemical deposition, diffusion barriers to prevent undesired materials from diffusing into adjacent structures, contact materials (e.g., metals, metal alloys, metal nitrides, etc.) for forming ohmic contacts with the metal oxide 22, contact materials (e.g., metals, metal alloys, metal nitrides, etc.) for forming Schottky contacts to the metal oxide 22, etc.

The conductive layers in element 12 may be formed from the same conductive material or different conductive materials. For example, a conductive layer in element 12 may include two nickel layers or may contain a nickel layer and a titanium nitride layer (as an example). Moreover, conductive layers in element 12 may be formed using the same techniques or different techniques. As an example, a conductive layer may include a metal layer formed using physical vapor deposition (PVD) techniques (e.g., sputter deposition) and a metal layer formed using electrochemical deposition techniques.

The portions of the conductive layers in element 12 that are immediately adjacent to metal oxide 22 or are otherwise in close association with metal oxide 22 are sometimes referred to as the electrodes of the resistive switching memory element 12.

In general, the electrodes of resistive switching memory element 12 may each include a single material, may each include multiple materials, may include materials formed using a single technique or a series of different techniques, or may include combinations of such materials.

Certain metals are particularly appropriate for forming metal oxide 22. These metals may include, for example, the transition metals and their alloys. Examples of transition metals that may be used in forming metal oxide include Ni, Ti, Co, Cu, Ta, W, and Mo.

With one particularly suitable arrangement, the metals for forming metal oxide 22 include nickel. The metal oxide 22 may include other dements in addition to nickel. For example, metal oxide 22 may be formed from a metal such as nickel that has been doped with a dopant material such as phosphorus. In this situation, metal oxide 22 will contain nickel, phosphorus, and oxygen. Other dopant materials that may be used include P, As, F, Cl, Al, and B.

Any suitable conductive materials may be used for forming the electrodes 20 and 24 of resistive switching memory element 12. Illustrative conductive materials include transition metals (and their nitrides), refractory metals (and their nitrides), and noble metals. Illustrative examples of metals that may be used as conductive materials include Ni, Ti, Co, Cu, Ta, W, and Mo. These are merely illustrative examples of materials that may be used. Combinations of two or more of these metals may be used or other suitable conductive materials may be used as electrodes 20 and 24, if desired.

The layers of material that are formed when fabricating elements 12 may be deposited using any suitable techniques. Illustrative deposition techniques include physical vapor deposition (e.g., sputter deposition or evaporation), chemical vapor deposition, atomic layer deposition, and electrochemical deposition (e.g., electroless deposition or electroplating). Metal oxide 22 may be formed by oxidizing one or more deposited layers.

Metals such as the transition metals can form stable stoichiometric oxides. For example, nickel forms the stoichiometric metal oxide NiO. Titanium forms the stoichiometric metal oxide $TiO_2$. While stoichiometric metal oxides may sometimes be suitable for forming a resistive switching metal oxide, there are advantages to forming sub-stoichiometric resistive switching metal oxides. Sub-stoichiometric resistive switching metal oxides (which are sometimes referred to as metal-deficient metal oxides) may exhibit lower densities and higher resistivities and better resistive switching properties (e.g. lower on/off currents, lower Vset/Vreset voltages, lower Iset/Ireset currents, lower forming voltages, etc.) than stoichiometric oxides. Higher resistivities may be beneficial when forming arrays of nonvolatile memory elements on an integrated circuit. If the resistance of an element is too low, it may be difficult to detect state changes. Resistive switching oxides with relatively large resistivities (e.g., over 10 ohm-cm or over 100 ohm-cm) may therefore be desirable or may even be required by certain nonvolatile memory architectures.

With conventional fabrication techniques such as sputtering, the amount of metal deficiency that can be achieved in a resistive switching metal oxide has been limited. For example, in nickel-based systems, the lowest ratio of nickel to oxygen that has been achieved has been about 0.8:1 (i.e., $Ni_{0.8}O$). Nickel oxide films of this type have exhibited relatively high densities (i.e., about 5.4 to 5.8 $g/cm^3$) and low resistivities (i.e., less than 10 ohm-cm).

In accordance with the present invention, nonvolatile memory elements are formed with super sub-stoichiometric resistive switching metal oxides. Using the techniques of the present invention, highly metal-deficient resistive switching metal oxides can be produced that have densities of 3-4 $g/cm^3$ or less and resistivities of 10 ohm-cm to 100 ohm-cm or more. These densities may be less than 65% to less than 80% of the stoichiometric metal oxide densities.

High levels of metal deficiency may be achieved by using silicon to consume part of the metal that would otherwise be incorporated into the resistive switching metal oxide. The silicon reacts with the metal and forms a metal silicide. The metal silicide may be used to form all or part of an electrode for the nonvolatile memory element.

Figure 7:
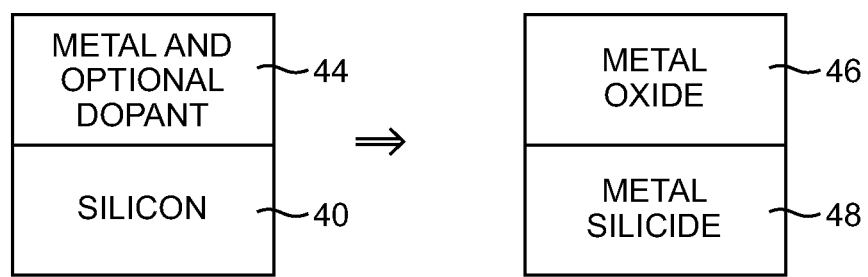
FIG. 7 is a cross-sectional diagram showing how a metal-deficient metal oxide may be formed on a metal silicide electrode by oxidizing a layer that contains a metal that has been deposited on a material containing silicon in accordance with an embodiment of the present invention.

A typical fabrication process is shown in FIG. 7. Initially, a silicon-containing layer 40 is formed. The silicon-containing layer may be formed from crystalline silicon, polysilicon, amorphous silicon, n-type silicon, p-type silicon, or any suitable material that contains silicon. The thickness of silicon-containing layer 40 depends on the type of fabrication process that is being used and the type of device architecture being used for the nonvolatile memory element. Typical silicon layer thicknesses are in the range of less than one micron (e.g., 10-1500 angstroms or 500-1500 angstroms). For example, a typical polysilicon layer might be 700 angstroms.

The layer of material that contains silicon may be fabricated using any suitable technique (e.g., physical vapor deposition, chemical vapor deposition, etc.). Silicon-containing layer 40 may be formed on previously fabricated layers of devices (e.g., in a stacked memory), may be formed on a substrate (e.g., a silicon substrate with or without layers of intervening material), or may be formed on any other suitable base layer.

After forming layer 40, a metal-containing layer 44 may be formed on top of layer 40, as shown in the left-hand side of FIG. 7. Layer 44 may have a thickness of ten times the thickness of layer 40 or less, five times the thickness of layer 40 or less, two times the thickness of layer 40 or less, or one times the thickness of layer 40 or less. The thickness of layer 44 will typically be in the range of 100-5000 angstroms and will be one or two times the thickness of layer 40 or less. Layer 44 may be a metal (e.g., a transition metal such as Ni, Ti, Co, Cu, Ta, W, or Mo) or may be formed from a combination of one or more such metals. Layer 44 may also contain optional dopant materials (e.g., P, As, F, CI, Al, or B). As an example, layer 44 may be formed from Ni or Ni and P.

Any suitable fabrication technique may be used to form layer 44. For example, one or more metals may be deposited using physical vapor deposition (PVD), chemical vapor deposition (CVD), atomic layer deposition, or electrochemical deposition (e.g., electroless deposition or electroplating). Dopant may be deposited at the same time as the metal (e.g., by co-sputtering the metal and the dopant or using alloy sputtering techniques or by depositing the metal and dopant material together as part of an electroless deposition process) or at different times (e,g., by implanting the dopant material into layer 44 via ion implantation). When dopant is incorporated into layer 44 as part of the layer formation process, the deposited layer 44 contains a mixture of metal and one or more other materials (e.g., dopant materials). If desired, layer 44 may be formed by depositing separate sublayers of materials. For example, a phosphorus-doped nickel layer may be formed by forming a nickel layer on top of a phosphorus-containing layer and subjecting the layers to heat (either when forming layer 44 or during subsequent processing steps).

An illustrative electroless deposition process that may be used to form layer 44 (i.e., when the layer being deposited is nickel containing phosphorus dopant) is based on an electroless solution containing a nickel sulfate reactant. A substrate on which layer 44 is being formed may be placed in a water bath containing nickel sulfate ($NiSO_4$) at a concentration of 0.015 M to 0.15M. in addition to the nickel sulfate reactant, the electroless solution may include a reducing agent such as ammonium hypophosphite ($NH_4H_2PO_2$) at concentrations of up to about 0.15 M. The ammonium hypophosphite supplies phosphorus to the deposited layer of electroless conductive material and acts as a reducing agent for deposition of nickel.

in a typical scenario, the phosphorus concentration in the deposited layer is approximately 1-10%.

After forming metal-containing layer 44 on silicon-containing layer 40, the metal-containing layer 44 is oxidized to form metal oxide 46. The silicon 40 is subjected to heat to form metal silicide 48. Metal silicide 48 is formed from the silicon in layer 40 and at least some of the metal in metal-containing layer 44. Because the silicon 40 reacts with the metal in layer 44, some of the metal that would otherwise be made available for oxidation to form metal oxide 46 is consumed. This reduces the metal concentration in metal oxide 46, so that metal oxide 46 is metal deficient. If sufficient silicon is used, the metal oxide 46 can be highly metal deficient. For example, if the metal oxide 46 has a composition of $M_xO_y$, wherein M is the metal and O is oxygen and if $M_aO_b$ represents a stoichiometric metal oxide formed from metal M and oxygen, the ratio of x/y may be less than 80% of a/b or even less than 65% of a/b.

Any suitable arrangement may be used for forming oxide 46 and silicide 48. Oxidation may be performed using rapid thermal oxidation (RTO) in a temperature range of 350° C. to 750° C. for less than 20 minutes (e.g., for 1-10 minutes at 550° C.). Oxidation may also be performed in a furnace at higher temperatures or using laser-induced heating. If desired, oxidation may also be performed by implanting oxygen ions into layer 44 (typically followed by an annealing operation). Combinations of these techniques may also be used.

Silicide 48 may be formed by subjecting layer 40 to heat in the presence of the metal and other materials of layer 44. The heat treatment used to form metal silicide layer 48 may be part of the same heat treatment used to form metal oxide 46 or may be part of a separate heat treatment. One or more heat treatment operations may be used to form layers 46 and 48. When it is desired to perform thermal oxidation to form layer 46, at least one of these operations is preferably performed in an oxygen environment.

In a typical arrangement, after layer 44 is formed on layer 40, a rapid thermal oxidation operation is performed (i.e., heating both layers 40 and 44 in a RTO tool in the presence of a gas mixture containing oxygen). In this type of scenario, the metal and other materials of layer 44 are oxidized by the oxygen, while concurrently the silicon of layer 40 reacts with the metal and potentially other materials of layer 44.

Figure 8:
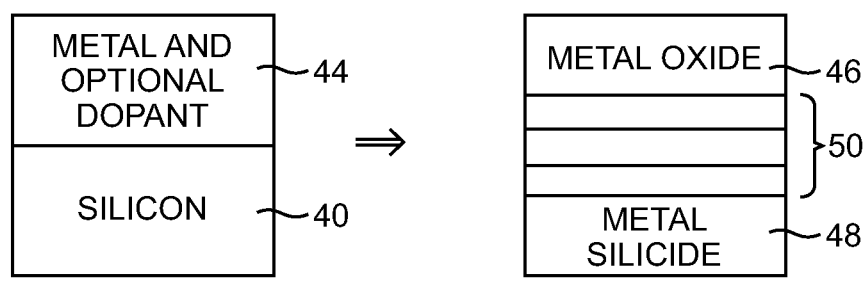
FIG. 8 is a cross-sectional diagram similar to that of FIG. 7 showing how one or more intermediate layers may be formed between the metal oxide and the metal silicide layers in accordance with an embodiment of the present invention.

As shown in FIG. 8, one or more intermediate layers 50 may be formed during the heat treatment that is applied following formation of layers 40 and 44. Layers 50 may be associated with metal oxide 46 and are sometimes referred to as sublayers of oxide 46. The sublayers 50 that are formed between metal oxide 46 and 48 may each contain metal, oxygen, and phosphorus (or other dopant material) in different proportions. The metal in layers 50 may be the same as the metal in the metal oxide and underlying metal silicide.

Figure 9:
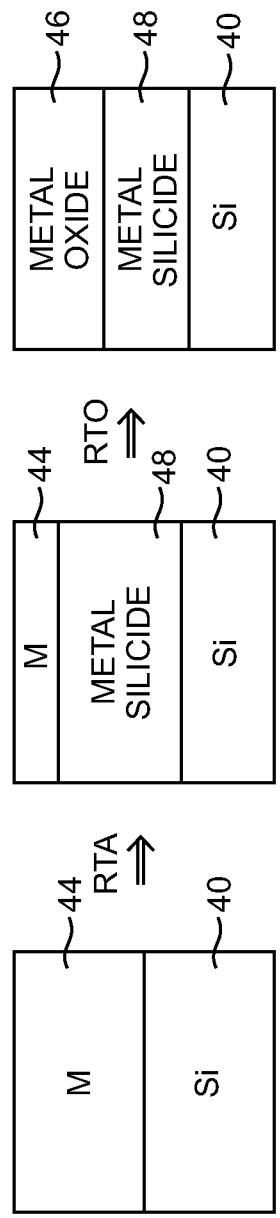
FIG. 9 is a cross-sectional diagram showing how a metal oxide on a metal silicide structure can be formed using separate rapid thermal anneal and oxidation operations in accordance with an embodiment of the present invention.

As shown in FIG. 9, the metal silicide 48 and the metal oxide layer 46 may be formed during separate steps. Initially, metal-containing layer 44 may be formed on silicon-containing layer 40, as shown on the left-hand side of FIG. 9. During a rapid thermal anneal (RTA) process (or other heat treatment), the metal of metal-containing layer 44 reacts with the silicon of silicon-containing layer 40 to form metal silicide layer 48, as shown in the center of FIG. 9. With a typical rapid thermal anneal process, the layers are subjected to a heat of 350-750° C. for 1-10 minutes in an atmosphere containing argon, nitrogen, hydrogen, or forming gas, or a combination of such non-oxygen-containing (and/or reducing) gases.

During heat treatment, all or part of the silicon-containing layer 40 may be consumed (in processes of the type shown in FIG. 9 or in processes of the type shown in FIGS. 7 and 8). In the example depicted in FIG. 9, only part of the silicon-containing layer 40 has been consumed. This is merely illustrative.

As shown in the center of FIG. 9, some of the metal layer 44 (e.g., 0 to 2500 angstroms) may not be converted into metal silicide. This residual layer may be removed (e.g., using a chemical bath) or may be retained as shown in FIG. 9.

After the anneal process is complete and the optional stripping of the residual metal layer 44 (if any is present) has been performed, a rapid thermal oxidation (or other thermal oxidation) may be performed to form metal oxide layer 46, as shown on the right-hand side of FIG. 9.

Figure 10:
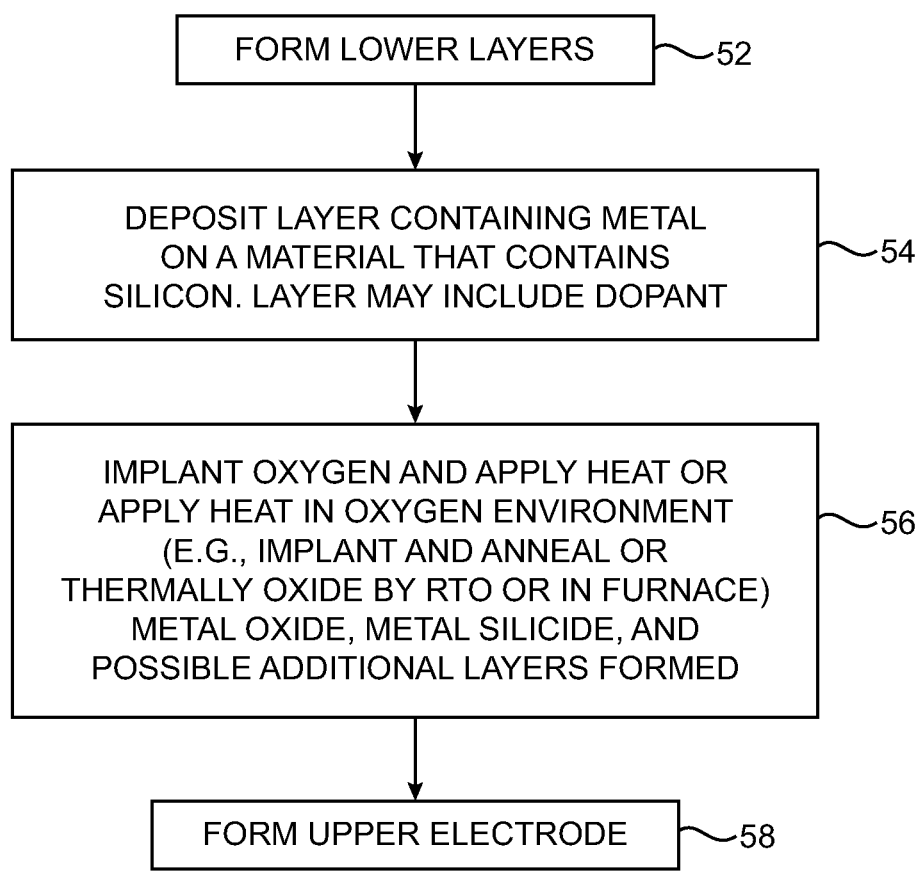
FIG. 10 is a flow chart of illustrative steps involved in forming a nonvolatile memory element containing a metal-deficient resistive switching metal oxide in accordance with an embodiment of the present invention.

Illustrative steps involved in forming nonvolatile memory elements using techniques of the type shown in FIGS. 7, 8, and 9 are shown in FIG. 10.

At step 52, one or more lower layers for the integrated circuit are formed. The lower layers may include a substrate (e.g., a silicon wafer), layers that form underlying layers of nonvolatile memory elements (e.g., when the integrated circuit being formed is a stacked memory device), conductive layers for routing, insulating layers for insulating conductive routing lines and nonvolatile memory elements from each other, or any other suitable layers of material. Silicon-containing layer 40 is formed at the top of these layers. For example, if silicon-containing layer 40 is a polysilicon layer, polysilicon may be deposited on underlying circuit layers. The silicon-containing layer 40 may be formed by PVD, CVD, or any other suitable fabrication technique.

After forming silicon-containing layer 40, layer 44 may be deposited at step 54. As described in connection with FIGS. 7, 8, and 9, layer 44 may contain one or more dopant materials and one or more metals. Layer 44 may be formed by PVD, CVD, atomic layer deposition, electrochemical deposition, etc. Dopant materials may be incorporated into layer 44 using ion-implantation techniques, by simultaneously depositing metal and dopant material (e.g., using PVD co-sputtering, PVD alloy sputtering, or electroless co-deposition, etc.), or by depositing a layer 44 that contains multiple sublayers of different materials.

After forming layers 40 and 44, a part of layer 44 oxidizes (e.g., the upper portion of layer 44) to form layer 46 and a part of layer 44 reacts with silicon-containing layer 40 to form layer 48 (step 56). Oxidation may be performed via ion implantation or using thermal oxidation. Heat may be applied during step 56 in one or more operations (e.g., as a single RTO operation or as an RTA operation followed by a RTO operation or in more operations). Heat may be applied to produce thermal oxidation (if desired) and to convert metal and silicon into metal silicide. Because layer 44 contributes the same metal to both metal oxide 46 and metal silicide 48, the resulting nonvolatile memory element will have a metal oxide that has the same metal as its underlying metal silicide layer 48. Metal silicide layer 48 may form all or part of a lower electrode such as electrode 24 of FIG. 2A.

The resistivity of metal oxide 46 may be greater than 10 ohm-cm or greater than 100 ohm-cm. The density of metal oxide 46 may be less than 3 g/cm$^3$ or less than 4 g/cm$^3$ (as examples). The thickness of metal oxide 46 may be 10-5000 angstroms (as an example). Because silicide layer 48 consumes metal from metal oxide 46, metal oxide 46 may be highly metal deficient. For example, metal oxide 46 may have only 80% (or less) or 65% (or less) of the metal content (or the film density) as compared to that which would be found in either i) a stoichiometric metal oxide formed from the same metal or ii) a sub-stoichiometric metal oxide formed from the same metal using conventional means.

It should be noted that another benefit of the present invention is the in-situ formation of a conductive lower electrode.

In another embodiment, one could implant the metal layer in step 54 (e.g. Ni) with a suitable dopant (such as P). The metal layer can be deposited using PVD. The dopant energy may be adjusted such that the dopant peak is approximately 0-250 A from the Si interface. The dopant dose is preferably >1E15/cm$^2$. Such a doped metal layer can then be oxidized in the manner described above.

Alternatively, the dopant can be added after the metal oxide is formed using ion implantation and a suitable activation heat treatment. For example, P or Fluorine can be implanted into NiO$_x$ and then activated with a rapid thermal anneal at temperatures ranging from approximately 550-750° C. in an inert ambient.

At step 58, an upper electrode may be formed on the metal oxide (e.g., using PVD, CVD, ALD, electrochemical deposition, etc.). The upper electrode may be formed from the same metal as the lower electrode (e.g., the same metal that is in metal oxide 46 and metal silicide 48) or from a different metal. Suitable metals for the upper electrode include transition metals such as Ni, Ti, Co, Cu, Ta, W, and Mo. If desired, a series-connected current steering element (e.g., a diode or transistor, etc.) can be formed either above and/or below the memory element (e.g. either above and/or below i) the metal oxide or ii) the upper or lower electrodes coupled to the metal oxide) as illustrated in FIGS. 2B, 4, 5 and 6.

The foregoing is merely illustrative of the principles of this invention and various modifications can be made by those skilled in the art without departing from the scope and spirit of the invention.

What is claimed:

1. A method of forming a nonvolatile memory element, comprising:
   providing a silicon substrate;
   depositing a first layer comprising a metal on the silicon substrate;
   forming a metal oxide in at least a top portion of the first layer,
   forming a metal silicide in at least a bottom portion of the first layer; and
   depositing an electrode over the metal oxide.

2. The method of claim 1, wherein the metal oxide and the metal silicide have a common metal source.

3. The method of claim 1, wherein the metal is a transition metal.

4. The method of claim 3, wherein the metal is one of Ni, Ti, Co, Ta, W or Mo.

5. The method of claim 4, wherein the metal is Ni.

6. The method of claim 1, further comprising connecting a current steering element to the memory element in series.

7. The method of claim 1, wherein the forming of the metal oxide comprises thermally oxidizing a portion of the first layer.

8. The method of claim 7, wherein the forming of the metal silicide and the forming of the metal oxide occur simultaneously.

9. The method of claim 1, wherein the forming of the metal silicide comprises annealing.

10. The method of claim 1, wherein the metal oxide has a thickness between 10 A and about 5000 A.

11. The method of claim 1, wherein the depositing of the metal layer comprises depositing a doped metal layer.

12. The method of claim 11, wherein the doped metal layer comprises phosphorus.

13. The method of claim 1, further comprising doping the metal oxide.

14. The method of claim 13, wherein the doping of the metal oxide comprises doping with phosphorus.

15. The method of claim 1, wherein the metal oxide has a density of 4 g/cm3.

16. The method of claim 1, wherein the metal oxide has a resistivity of greater than 10 ohm-cm.

17. The method of claim 16, wherein the metal oxide has a resistivity of greater than 100 ohm-cm.

18. The method of claim 1, wherein the metal oxide has a composition of MxOy, whereas M is a metal, O is oxygen, and x/y represents less than 65% of a stoichiometric ratio.

19. A method of forming a non-volatile memory element, comprising:
   providing a silicon substrate;
   depositing a first layer comprising a doped metal on the silicon substrate; and
   thermally oxidizing a top portion of the first layer, wherein the thermally oxidizing of the top portion of the first layer causes a portion of the metal of the first layer to react with at least a portion of the silicon substrate to form a metal silicide.

* * * * *